(12) United States Patent
Borot et al.

(10) Patent No.: US 7,320,923 B2
(45) Date of Patent: Jan. 22, 2008

(54) SRAM CELL

(75) Inventors: Bertrand Borot, Cheylas (FR); Philippe Coronel, Barraux (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 152 days.

(21) Appl. No.: 11/305,553

(22) Filed: Dec. 16, 2005

(65) Prior Publication Data
US 2006/0134876 A1   Jun. 22, 2006

(30) Foreign Application Priority Data
Dec. 16, 2004  (FR) ................................. 04 53012

(51) Int. Cl.
*H01L 21/331* (2006.01)
(52) U.S. Cl. .................. 438/381; 438/382; 438/393; 438/226; 257/393; 257/E27.101; 257/E27.098
(58) Field of Classification Search .......... 438/382, 438/381, 369, 226, 245, 838, 384, 385, 250; 364/154; 357/59; 257/379, 411, 659, 303, 257/350, E27.098, E27.101, 339; G11C 11/412; H01L 27/11
See application file for complete search history.

(56) References Cited
U.S. PATENT DOCUMENTS
4,377,819 A   3/1983  Sakai et al.
5,825,684 A   10/1998 Lee
5,880,497 A * 3/1999  Ikeda et al. .................. 257/298
6,130,154 A * 10/2000 Yokoyama et al. ......... 438/627
2004/0164360 A1* 8/2004  Nishida et al. .............. 257/393

FOREIGN PATENT DOCUMENTS
JP       09275150 A  * 10/1997

OTHER PUBLICATIONS
French Search Report from French Patent Application 04/53012, filed Dec. 16, 2004.

* cited by examiner

Primary Examiner—Terrell L. McKinnon
Assistant Examiner—Shaka Scarlett
(74) Attorney, Agent, or Firm—Lisa K. Jorgenson; James H. Morris; Wolf, Greenfield & Sacks, P.C.

(57) ABSTRACT

A method for forming a resistor of high value in a semiconductor substrate including forming a stack of a first insulating layer, a first conductive layer, a second insulating layer, and a third insulating layer, the third insulating layer being selectively etchable with respect to the second insulating layer; etching the stack, to expose the substrate and keep the stack in the form of a line; forming insulating spacers on the lateral walls of the line; performing an epitaxial growth of a single-crystal semiconductor on the substrate, on either side of the line; selectively removing the third insulating layer to partially expose the second insulating layer at a predetermined location; and depositing and etching a conductive material to fill the cavity formed by the previous removal of the third insulating layer.

15 Claims, 3 Drawing Sheets

SRAM CELL

BACKGROUND OF THE INVENTION

1. Field of the Invention

The present invention generally relates to the monolithic forming of RAMs in a semiconductor substrate. More specifically, the present invention relates to the forming of SRAMs.

2. Discussion of the Related Art

It has been provided to form SRAM networks based on the repetition of an elementary cell comprising four transistors and two resistors.

FIG. 1 is an electric diagram of such a cell 1. Cell 1 comprises two series associations R3-N3 and R5-N5 of a resistor R3, R5 and of an N-channel MOS transistor N3, N5. Resistors R3 and R5 are identical. Transistors N3 and N5 are identical. Each series association R3-N3 and R5-N5 is connected between a high supply rail Vdd, by the free end of resistor R3 or R5, and a low reference supply rail or ground GND, by the source of transistor N3 or N5. The junction point of a first association R3-N3, that is, drain D3 of transistor N3, is interconnected to the gate of transistor N5 of the second association R5-N5. Interconnection node D3 is connected to a bit line BLT via an N-channel read/write MOS transistor N8 having its gate connected to word line WL of cell 1. Point D3 then is the junction point of transistors N8 and N3 between bit line BLT and ground GND. Symmetrically, junction point D5 of the second series association R5-N5 is interconnected at a node P to the gate of transistor N3 of the other association R3-N3. Interconnection node P is connected to an inverse bit line BLF via an N-channel MOS read/write transistor N9 having its gate connected to word line WL of cell 1. Node D5 then is the junction point of transistors N9 and N5 between inverse bit lines BLF and ground GND.

FIG. 2 illustrates, in partial simplified top view, a monolithic embodiment of cell 1. The two transistors N3 and N8 having a common drain D3 are formed in a same N-type active region 24. Similarly, the two transistors N5 and N9 having a common drain D5 are formed in a same N-type active region 26. Active regions 24 and 26 are shown in the form of rectangles with their long sides extending along the vertical direction of FIG. 2. Active regions 24 and 26 are separated by an insulating area 28. The two insulated gates of transistors N8 and N3 divide region 24 into three portions. The high portion forms the source of transistor N8 connected to bit line BLT. The low portion forms the source of transistor N3 connected to ground GND. The high insulated gate of transistor N8 forms a word line WL of cell 1. The central portion of region 24 forms the common drain of transistors N3 and N8 solid with a metallization D3.

Symmetrically, in region 26 are formed, between a ground contact GND and an inverse bit line contact BLF, the source of transistor N5, common drain D5 of transistors N9 and N5, and the source of transistor N9. The gate of transistor N9 is a word line WL. The gate of transistor N5 is connected to drain D3 by resistor R3. Drain D5 is connected by a metallization to the gate of transistor N3.

Resistor R3 is formed between metallization D3 and a high supply contact Vdd. Resistor R5 is formed between metallization D5 and a high supply contact Vdd. Resistors R3 and R5 are conventionally formed in the substrate in the form of lightly-doped wells or in the interconnect metallization levels in the form of metal tracks.

To ensure a low power consumption of the memory formed by the repetition of cell 1, the total resistance connected to power supply Vdd, that is, the value of resistances R3 and R5, must be very high, on the order of some hundred megaohms (MΩ) or more.

Such values make resistors R3 and R5 very bulky, since the wells or the tracks which form them have significant integration surface areas.

It is thus currently preferred to use SRAM networks formed of elementary cells with six transistors, four of which with an N channel and two with a P channel. Each elementary cell is then formed in four active regions, two regions each comprising two N-channel transistors and the two other each comprising a P-channel transistor.

It would be desirable to further reduce the elementary cell dimensions to increase the density of SRAMs.

SUMMARY OF THE INVENTION

The present invention aims at providing a method for manufacturing such an SRAM cell.

The present invention also aims at providing such a method for manufacturing such a cell having a decreased power consumption.

To achieve these and other objects, the present invention provides a method for forming a resistor of high value in a semiconductor substrate comprising:

forming a stack of a first insulating layer, of a first conductive layer, of a second insulating layer, and of a third insulating layer, the third insulating layer being selectively etchable with respect to the second insulating layer;

etching the stack, to expose the substrate and keep the stack in the form of a line;

forming insulating spacers on the lateral walls of the line;

performing an epitaxial growth of a single-crystal semiconductor on the substrate, on either side of the line;

selectively removing the third insulating layer to partially expose the second insulating layer at a predetermined location; and depositing and etching a conductive material to fill the cavity formed by the previous removal of the third insulating layer.

The present invention also provides a method for forming an SRAM cell with four transistors and two resistors, the two resistors being formed by the previous method in an insulation area separating two active regions in which the transistors are formed in pairs, the resistors being formed vertically under metallizations of interconnection of the gate of a transistor of one of the pairs having its source connected to the cell ground and of the common drain of the transistors of the other pair.

The foregoing and other objects, features, and advantages of the present invention will be discussed in detail in the following non-limiting description of specific embodiments in connection with the accompanying drawings.

DETAILED DESCRIPTION

Figure 2:
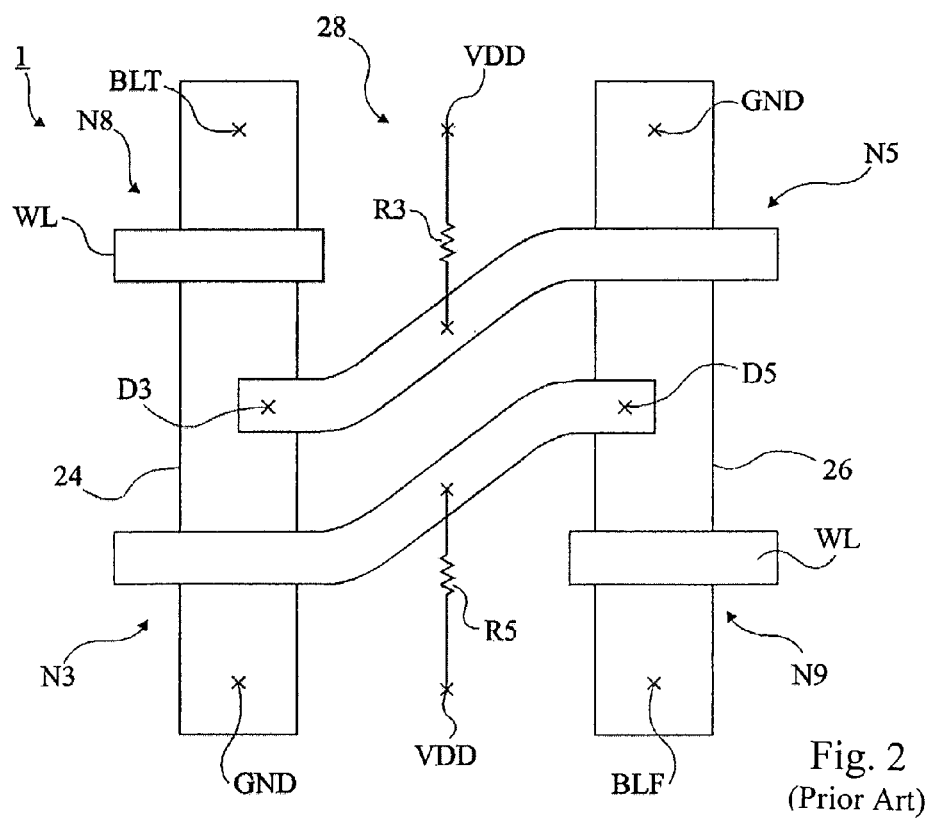
FIG. 2 illustrates, in simplified partial top view, a known embodiment of the cell of FIG. 1.
Figure 3:
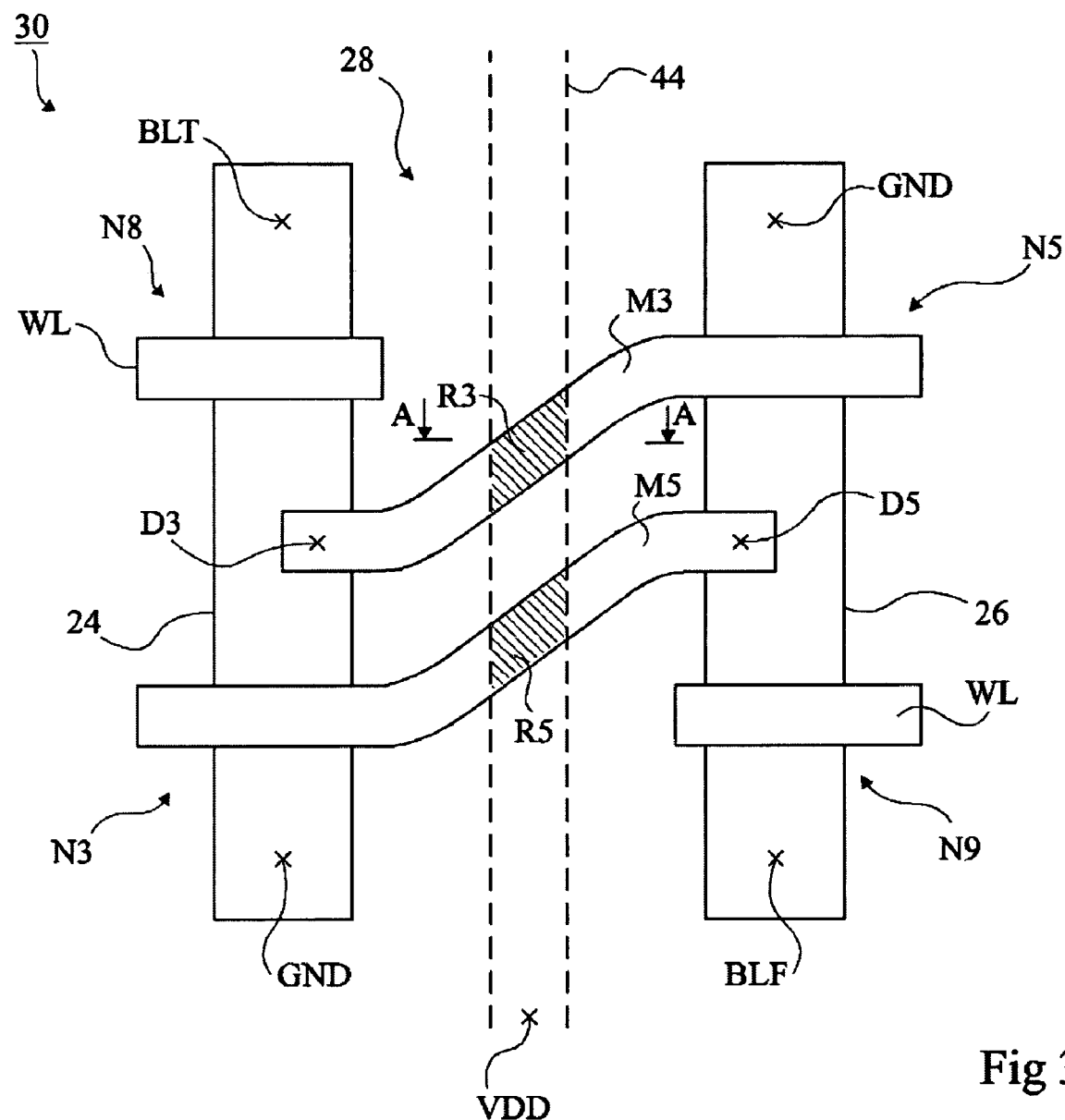
FIG. 3 illustrates, in partial simplified top view, an SRAM cell with four transistors thanks a method according to an embodiment of the present invention.

For clarity, the same elements have been designated with the same reference numerals in the different drawings and, further, as usual in the representation of integrated circuits, the top views of FIGS. 2 and 3 as well as the cross-section views of FIGS. 4A to 4D are not to scale.

The present invention provides for decreasing the integration surface area of the cell with four transistors and two resistors to a value smaller than that of a cell with six transistors.

Figure 1:
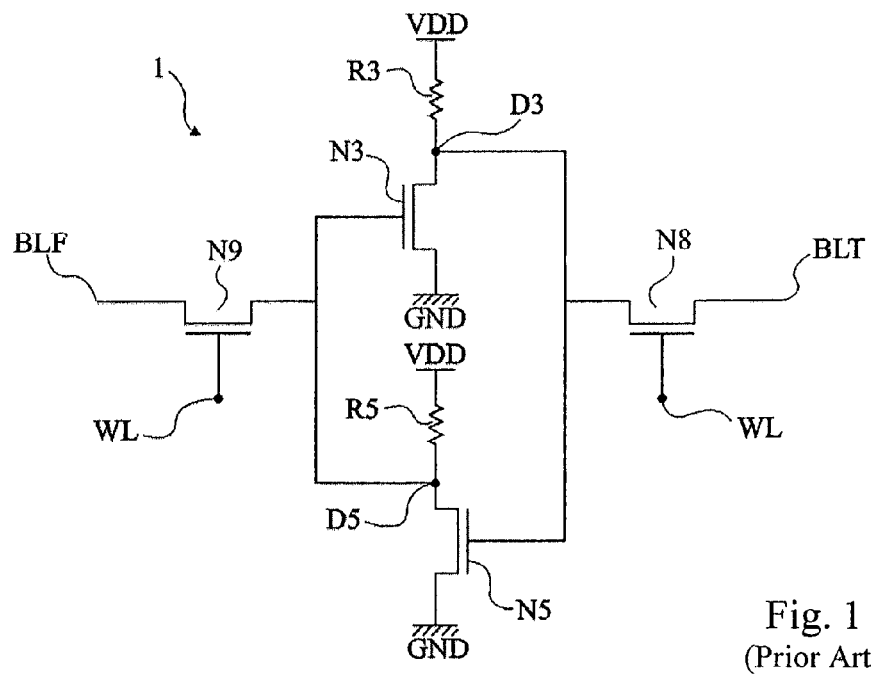
FIG. 1 is an electric diagram of a known SRAM cell with four transistors and two resistors.

For this purpose, the present inventors provide using a novel integration method in which resistors R3 and R5 of FIG. 1 are no longer formed as wells in a substrate, nor as metal tracks, but by the leakages of a low-capacitance capacitor formed in the insulation area separating the two active regions in which the cell transistors are formed.

FIG. 3 illustrates, in a partial simplified top view, an SRAM cell 30 obtained thanks to a method according to an embodiment of the present invention.

Transistors N3, N5, N8, and N9 are formed as in the structure of FIG. 2 in pairs N3 and N8, N5 and N9 in two active regions 24 and 26.

A buried line 44, illustrated in dotted lines, runs through region 28 separating the two active regions 24 and 26. Buried line 44 is intended to form the high supply rail Vdd of FIG. 1. Line 44 crosses metallizations M3 and M5 respectively connecting drain D3 to the gate of transistor N5 and drain D5 to the gate of transistor N3.

Resistors R3 and R5 are formed by capacitors with high leakages located at the crossings, illustrated by hatchings in FIG. 3. The capacitors-resistors are vertically formed in insulation area 28 so that line 44—supply Vdd—forms a first common electrode of the capacitors. The second electrode of the capacitors-resistors contacts drain metallization D3 or D5 of the associated transistor N3 or N5, respectively.

FIGS. 4A to 4D illustrate, in a partial simplified cross-section view, various steps of the manufacturing of resistor R3 in cross-section view along axis A-A of FIG. 3 according to an embodiment of the present invention.

Figure 4A:
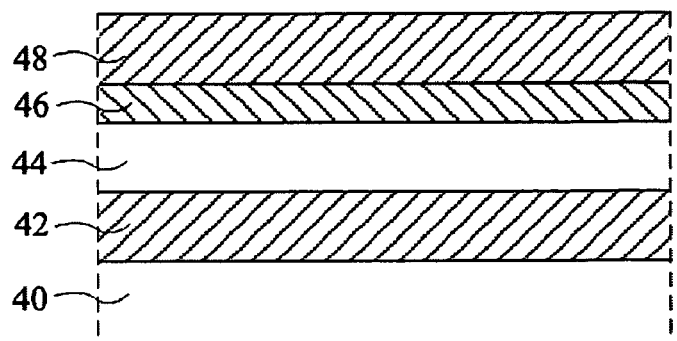
FIGS. 4A to 4D illustrate, in partial simplified cross-section view, steps of a method for forming a portion of the SRAM cell of FIG. 3 according to an embodiment of the present invention.

As illustrated in FIG. 4A, the method of the present invention starts with the successive depositions on a single-crystal semiconductor substrate 40, for example, silicon, of an insulating layer 42, of a conductive layer 44, for example, titanium nitride, of a dielectric layer 46, the structure of which will be described in detail subsequently, and of an insulating layer 48. As will appear from the following description, the thickness of insulating layer 42 is selected to guarantee an insulation between underlying substrate 40 and superposed conductive layer 44, with no capacitive coupling between substrate 40 and layer 44.

Figure 4B:
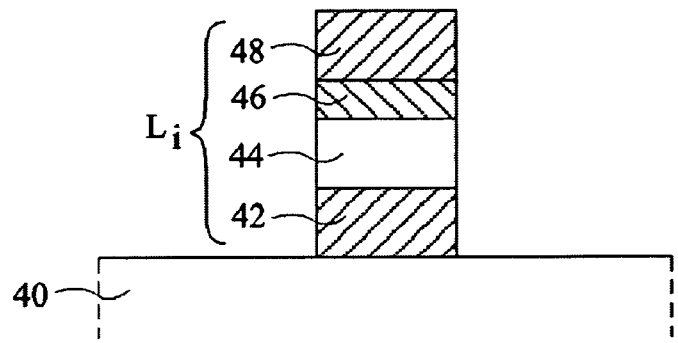

At the next steps, the stacking of four layers 48, 46, 44, and 42 is selectively etched to only leave them in place along parallel lines. Between two such lines, substrate 40 is exposed. FIG. 4B illustrates such a line $L_i$.

Figure 4C:
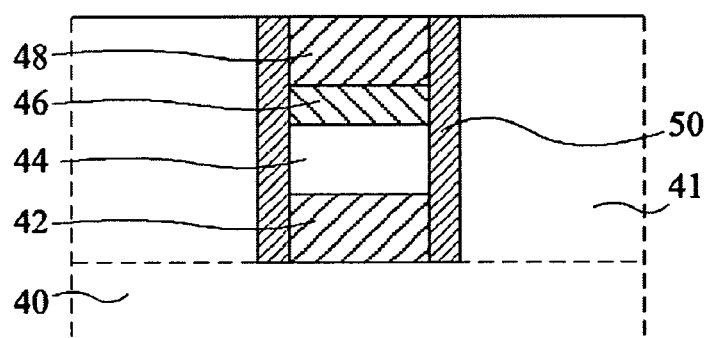

As illustrated in FIG. 4C, the method carries on with the deposition of the vertical walls of line $L_i$ of an insulating spacer 50. Then, a single-crystal layer 41 is grown by selective epitaxy on substrate 40, on either side of lines $L_i$, until the upper surface of layer 41 is coplanar with the top of line Li, that is, the upper surface of insulating layer 48. The nature and the thickness of spacer 50 are selected to avoid any capacitive coupling between conductive layer 44 and substrate 40-41. Epitaxial layer 41 may be of same nature and doping as substrate 40 or it may be optimized for reasons which will occur to those skilled in the art.

Figure 4D:
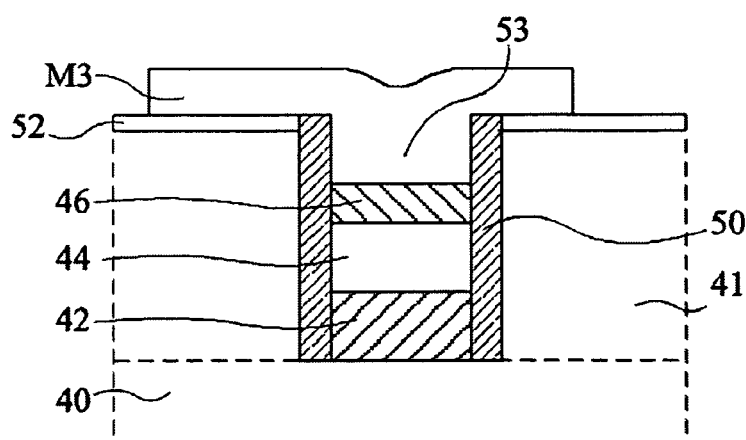

At the next steps, illustrated in FIG. 4D, portions of insulating layer 48 are eliminated to locally expose dielectric layer 46 at determined locations (where resistors-capacitors are desired to be formed). Then, an insulating layer is formed at the surface of substrate 40. A conductive layer, for example, polysilicon, which corresponds to metallization M3 of FIG. 3 is conformally deposited and etched. After its etching, layer 53 remains in place in the openings formed by the partial removal of insulating layer 48 and extends from each of these openings over substrate 40.

A capacitor having line 44 as its first electrode, layer 46 as its dielectric, and metallization M3 as its second electrode has thus been formed. The nature and the forming of dielectric layer 46 are selected so that the capacitor exhibits significant leakages, that is, a high parasitic resistance on the order of some hundred megaohms (MΩ) while its capacitance is negligible. The assembly of line 44, of dielectric 46, and of metallization M3 then forms a resistor.

It should be understood, referring to the top view of FIG. 3, that at the step described in relation with FIG. 4D, upper insulating layer 48 is removed and replaced with an electrode at the sole locations where resistors R3 and R5 of cell 1 are formed at the intersections between supply line 44 Vdd and the metal interconnects forming points D3 and D5 of FIG. 1. Outside of these locations, the structure remains such as described in relation with FIG. 4C, ensuring the continuity of buried line 44 connected to power supply Vdd.

The conventional steps of forming of active areas in the substrate have not been described hereabove. These steps will take place after forming of epitaxial layer 41.

An advantage of such a memory cell is the fact that, as compared with a conventional memory cell with four transistors and two resistors, it exhibits a much smaller integration surface area. More specifically, the integration surface area of resistors R3 and R5 is considerably decreased.

Further, the surface area taken up by the memory cell with four transistors and two resistors obtained thanks to the method according to the present invention is smaller than the surface area taken up by a conventional memory cell with six transistors. Indeed, as compared with the conventional structure of FIG. 2, the memory cell of FIG. 3 requires one less active area and insulation area. Given a technological process, in which the minimum dimensions of the lines and vias are set, the SRAM cell of FIG. 3 exhibits a surface area by 25% smaller than that of the conventional cell of FIG. 2.

Another advantage of the structure obtained thanks to the method according to the present invention lies in the burying of supply rail Vdd 44 under resistors R3 and R5. Indeed, in conventional structures, especially the structure with six transistors, the supply rail must be provided to be formed in a metallization level superposed to the semiconductor substrate. Forming supply rail Vdd directly in the substrate enables decreasing the number of metallization levels, or benefiting from additional space in the metallization levels. This enables and/or advantageously simplifies the forming in the metallization levels of elements associated with the SRAM.

Of course, the present invention is likely to have various alterations, modifications, and improvements which will readily occur to those skilled in the art. Especially, the shapes in top view of lines $L_i$ and/of the openings of removal of insulating layer 48 (FIG. 4D) may be selected to optimize the desired resistance values.

Further, it will be within the abilities of those skilled in the art to reproduce the described cell to form a memory network formed of hundreds of thousands of such cells.

Further, the following materials and thicknesses may be selected for the various mentioned layers:

insulating layer 42: silicon oxide layer ($SiO_2$) with a thickness from 150 to 250 nm;

conductive layer 44: titanium nitride layer from 50 to 150 nm;

dielectric layer 46: layer with a thickness from 3 to 30 nm, of any insulator such as silicon oxide, silicon nitride ($Si_3N_4$), silicon oxynitride (SiON), or any other insulator selected from among the insulators used in the forming of integrated circuits, especially insulators with a high dielectric permittivity;

insulating layer 48: silicon oxide layer, preferably of TEOS type, with a thickness from 100 to 200 nm;

spacer 50: silicon nitride ($Si_3N_4$) or oxynitride (SiON) layer with a thickness from 30 to 100 nm; and insulating layer 52: silicon oxide layer, preferably of TEOS or HDP type, with a thickness from 500 to 800 nm.

These indications are given as an example only and it will be within the abilities of those skilled in the art to select the materials and their necessary thicknesses in a given technological process. In particular, it will be within the abilities of those skilled in the art to select a dielectric 46 exhibiting a leakage rate capable of transforming capacitor 44-46-53 into a resistor exhibiting a very low, negligible, capacitive character.

Further, it should be noted that "substrate" is used to designate a uniformly-doped silicon wafer as well as epitaxial areas and/or areas specifically doped by diffusion/implantation formed on or in a solid substrate.

Generally, although the present invention has been described in the context of a silicon manufacturing process, it applies to any integrated circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming a resistor of high value in a semiconductor substrate comprising the steps of:
   forming a stack of a first insulating layer, a first conductive layer, a second insulating layer, and a third insulating layer, the third insulating layer being selectively etchable with respect to the second insulating layer;
   etching the stack to expose the substrate and to retain portions of the stack along a line on the substrate;
   forming insulating spacers on lateral walls of the line;
   performing an epitaxial growth of a single-crystal semiconductor on the lateral walls of the line;
   selectively removing the third insulating layer to form a cavity that partially exposes the second insulating layer at a predetermined location on the line; and
   depositing and etching a conductive material into the cavity.

2. A method for forming an SRAM cell with four transistors and two resistors, wherein the two resistors are formed by the method of claim 1 in an insulation area that separates two active regions of the SRAM cell, the transistors formed in pairs, the resistors being formed vertically under metallizations that connect a common drain of one of the pairs of transistors and a gate of another of the pairs of transistors that has a source connected to ground.

3. The method according to claim 2, wherein the substrate is a single-crystal silicon substrate.

4. The method according to claim 2, wherein the first insulating layer is a silicon oxide layer having a thickness in a range between approximately 150 and approximately 250 nm.

5. The method according to claim 2, wherein the first conductive layer is a titanium nitride layer having a thickness in a range between approximately 50 and approximately 150 nm.

6. The method according to claim 2, wherein the second insulating layer is made of an insulator selected from a group consisting of: silicon oxide, silicon nitride, and silicon oxynitride.

7. The method according to claim 2, wherein the third insulating layer is a silicon oxide layer having a thickness in a range between approximately 100 and approximately 300 nm.

8. The method according to claim 2, wherein the insulating spacers have a thickness in a range between approximately 30 and approximately 100 nm and are made of a material selected from the group consisting of: silicon nitride and oxynitride.

9. The method according to claim 2, wherein the conductive material is polycrystalline silicon.

10. The method according to claim 1, wherein the resistor has a resistive value greater than about 100 MΩ.

11. A method for forming an SRAM cell, the method comprising:
    providing a substrate;
    forming a first and a second active region on the substrate;
    forming a supply line positioned between the first and second active regions; and
    forming two or more leakage capacitors on the supply line, the supply line providing a first electrode that is common to each of the two or more leakage capacitors.

12. The method according to claim 11, further comprising:
    forming two pairs of transistors, one of the pairs of transistors positioned in the first active region and another of the ports of transistors positioned in the second active region.

13. The method according to claim 12, wherein forming two pairs of transistors comprises forming two pairs of N-channel MOS transistors, each of the two pairs having a common drain region.

14. The method according to claim 11, further comprising:
    forming a second electrode of each of the two or more capacitors, the second electrode connected through a single metallization to a common drain region of one of the first and second active regions, and to a gate of a transistor of another of the first and second active regions.

15. The method according to claim 11, wherein forming two or more leakage capacitors comprises forming the first electrode of the capacitor as a titanium nitride layer having a thickness in a range between approximately 50 nm and approximately 100 nm.

* * * * *

UNITED STATES PATENT AND TRADEMARK OFFICE
CERTIFICATE OF CORRECTION

| | |
|---|---|
| PATENT NO. | : 7,320,923 B2 |
| APPLICATION NO. | : 11/305553 |
| DATED | : January 22, 2008 |
| INVENTOR(S) | : Bertrand Borot et al. |

It is certified that error appears in the above-identified patent and that said Letters Patent is hereby corrected as shown below:

Col. 2, line 62 should read:
cell with four transistors obtained according to an Signed and Sealed this Sixth Day of May, 2008

JON W. DUDAS
*Director of the United States Patent and Trademark Office*